United States Patent [19]
Crispell

[11] Patent Number: 6,057,700
[45] Date of Patent: May 2, 2000

[54] PRESSURE CONTROLLED ALIGNMENT FIXTURE

[75] Inventor: Robert Brian Crispell, Mohnton, Pa.

[73] Assignee: Lucent Technologies, Inc., Murray Hill, N.J.

[21] Appl. No.: 09/073,279

[22] Filed: May 6, 1998

[51] Int. Cl.[7] ............................ G01R 31/02; G01R 31/26
[52] U.S. Cl. ........................ 324/765; 324/757; 324/758; 439/73
[58] Field of Search ...................................... 324/754, 755, 324/757, 758, 765; 439/72, 73, 91, 266

[56] References Cited

U.S. PATENT DOCUMENTS

| | | | |
|---|---|---|---|
| 4,843,313 | 6/1989 | Walton | 324/763 |
| 5,206,585 | 4/1993 | Chang et al. . | |
| 5,406,211 | 4/1995 | Inoue et al. | 324/758 |
| 5,528,466 | 6/1996 | Lim et al. | 361/820 |
| 5,847,572 | 12/1998 | Iwasaki et al. | 324/755 |

*Primary Examiner*—Josie Ballato
*Assistant Examiner*—Russell M. Kobert

[57] ABSTRACT

A test fixture that exhibits relatively low parasitic impedance and inductance characteristics (thereby allowing for high speed —several GHz testing) while capable of high volume testing. The fixture utilizes a high dielectric test substrate with gold test leads for best performance. A two-piece test fixture is aligned with and attached to the substrate, with a layer of vertically conductive material disposed between the substrate and the fixture. A first component of the two-piece test fixture include a central aperture for holding the test package in alignment with the leads formed on the test substrate. A second component of the two-piece test fixture covers the package and exerts a predetermined force on the package leads, thereby inducing conductivity through the vertically conductive material and forming a conduction path from the substrate to the package leads.

10 Claims, 2 Drawing Sheets

PRESSURE CONTROLLED ALIGNMENT FIXTURE

BACKGROUND OF THE INVENTION

1. Field of the Invention

The present invention relates to an alignment fixture for implementing RF and DC testing of integrated circuit packages and, more particularly, to a fixture capable of performing multi-GHz testing on large volumes of packages.

2. Desciption of the Prior Art

During the manufacture of integrated circuit devices, it is necessary to test the performance of the packaged device. A typical test fixture comprises a spring-controlled socket, with the packaged device placed in the socket and the spring control used to "lock" the package in the socket during testing. Once the testing is completed, the spring is released and the device removed. Advantageously, the same socket may be used time and again, providing a test fixture that may be used for large volumes of a particular integrated circuit package.

Although the use of a spring-controlled socket test fixture is useful for many packages, as integrated circuit speed increases (for example, 2.5 GHz and above), the parasitic inductance and capacitance associated with the conventional socket test fixture becomes intolerable. That is, the level of the parasitics begins to interfere with the test measurements. A prior art attempt at solving this problem is to use gold lead lines on the test fixture and form the test structure of a high dielectric material. While an improvement over the prior art, the best connections of the test package to this arrangement require soldering the package to the test structure. The soldering requirement thus slows down the testing process and is, in reality, not a solution for high volume testing applications.

Thus, a need remains in the prior art for a test fixture capable of testing devices at speeds of several GHz without exhibiting the high parasitic capacitance and inductance effects of the prior art arrangements.

SUMMARY OF THE INVENTION

The need remaining in the prior art is addressed by the present invention, which relates to an alignment fixture for implementing RF and DC testing of integrated circuit packages and, more particularly, to a fixture capable of performing multi-GHz testing on large volumes of packages. In accordance with the present invention, the alignment arrangement comprises a dielectric board containing the required testing bond pad sites. A two-piece alignment fixture is used, including a base piece part that is positioned over the dielectric board and a lid that mates with the base. In use, a vertically conductive material is disposed between the substrate and the base. A vertically conductive material is a polymer that is only conductive under pressure and is only conductive in the direction of the applied force. The package to be tested is disposed in an aperture formed in the base, where the aperture is formed to provide the necessary alignment between the testing bond pad sites on the dielectric board and the package leads. Next, the lid piece part is positioned to cover the base and package. A controlled pressure is then exerted on the lid, "activating" the pressure-controlled conductive material and resulting in providing a consistent conductive path between the board and the package. When the testing is completed, the pressure is released and the lid removed. A conventional pick-and-place apparatus may be used to both insert and remove the package being tested.

It is an advantage of the present invention that the relative thinness of the vertically conductive material does not add any appreciable parasitic inductance or capacitance to the performance of the package during RF testing. The use of gold contacts on a high dielectric test substrate, in combination with the thin conductive material thus forms a test fixture capable of performing high speed (several GHz, for example) performance testing. Additionally, the use of a two-piece test fixture, in combination with a conventional pick-and-place unit, results in a test fixture that is readily capable of performing repeatable testing processes on large volumes of integrated circuit packages.

Other and further advantages of the present invention will become apparent during the course of the following discussion and by reference to the accompanying drawings.

BRIEF DESCRIPTION OF THE DRAWINGS

Referring now to the drawings, where like numerals represent like parts in several views.

DETAILED DESCRIPTION

Figure 1:
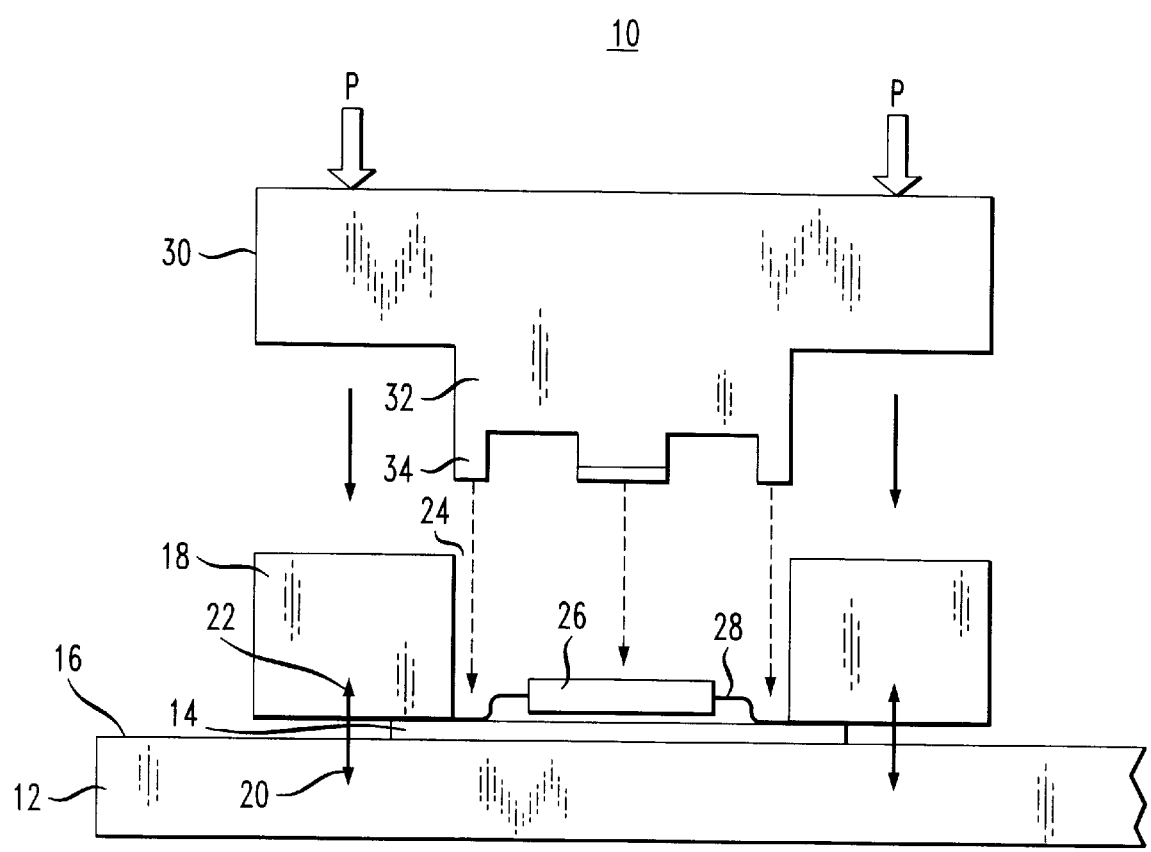
FIG. 1 is an exploded view of the pressured controlled test fixture of the present invention.

An exemplary pressure controlled test fixture 10, formed in accordance with the present invention, is illustrated (in exploded form) in FIG. 1. Fixture 10 comprises a dielectric substrate 12 including a surface layer of bond pad sites and test leads (not shown). In general, the dielectric substrate should be formed of a high dielectric material (for example, polyethyleneterephthalate, or PTFE) and the test leads and bond pad sites should be formed of a highly conductive material (for example, gold) to provide the least amount of additional impedance/capacitance to the test fixture. The use of a high dielectric substrate with gold test leads is considered to be well-known in the art and does not need to be described in detail to gain an understanding of the arrangement of the present invention.

A relatively thin (e.g., 15 mil) layer of vertically conductive material 14 is then disposed to cover top surface 16 of substrate 12 so as to overlay the locations of the bond pad sites. Vertically conductive material, also referred to a conductive inerconnect polymer, comprises a polymer incorporating extremely minute spheres of conductive material (such as gold). When a predetermined amount of pressure is applied to the material, the spheres align such that the material becomes conductive in the direction of the applied force. In the exemplary embodiment of the present invention, a "vertical" force is applied to the test fixture, so material 14 may be referred to, at times, as a "vertically conductive" material. Referring back to FIG. 1, a first piece part 18 of the test fixture (hereinafter referred to as the "base") is aligned with and attached to substrate 12. Alignment fiducials 20 and 22 formed in substrate 12 and base 18, respectively, are positioned to mate when base 18 is placed on substrate 12. Base 18 includes a central aperture 24 that is sized to allow for a test package 26 to be placed therein. Therefore, alignment fiducials 20,22 are positioned so that aperture 24 will enable the underlying test leads to be coupled to the test leads exiting package 26. A conventional pick-and-place unit may be used to insert test package 26 in aperture 24 (as well as remove package 26 after testing is completed). In particular, aperture 24 is formed so that test package 26 may be oriented in only one direction, thus providing the necessary alignment of leads 28 on package 26 with the bond pad sites and leads formed on substrate 12.

Once package 26 is in place, the remaining piece part 30 of the test fixture (hereinafter referred to as the "lid"), is disposed to cover base 18. As shown in FIG. 1, lid includes a central extended region 32 that terminates in a set of tabs 34. Each tab 34, upon engagement of lid 30 with base 18, will impinge a set of leads 28 of package 26. In accordance with the teachings of the present invention, a predetermined pressure P (any suitable pressure, for example 0.25–10 psi - or higher) is then exerted on lid 30, as shown in FIG. 1. The pressure results in forcing tabs 34 against leads 28, which in turn forces leads 28 against vertically conductive material 14. The presence of this pressure results in inducing the conductive behavior of material 14, thus forming a conductive path between the test leads on board 12 and leads 28 of package 26.

While the force is being exerted on lid 30, the various DC and RF tests are performed on test package 26. When testing is completed, the pressure is released, lid 30 is removed and package 26 is lifted out of base 18. Another package is then loaded into the base piece part, the lid replaced and the testing is re-initiated. Without the need to directly attach the test package to the substrate, the test fixture of the present invention allows for a large volume of packages to be tested relatively quickly. Moreover, the use of a constant pressure applied to the package lid allows for the test results to be consistent, improving the overall quality of the test process.

Figure 2:
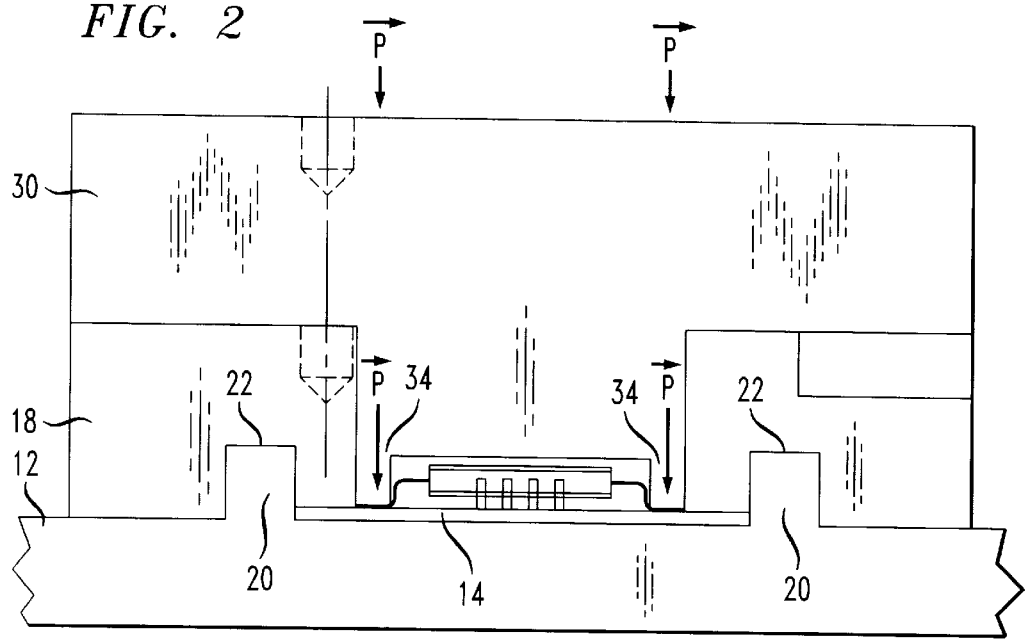
FIG. 2 is a cut-away side view of the test fixture of FIG. 1 with the lid of the test fixture in contact with the base.

FIG. 2 is cut-away side view of test fixture 10, illustrating all piece parts in intimate contact. Shown in this view is the force, P, exerted on top surface 32 of lid 30 being transferred to tabs 34 so as to induce conductivity within material 14 and provide the required electrical connection between leads 28 and the substrate test leads. The relatively small thickness of material 14 (e.g., 15 mils) is not considered to add any appreciable parasitic affect to the test measurements.

Figure 3:
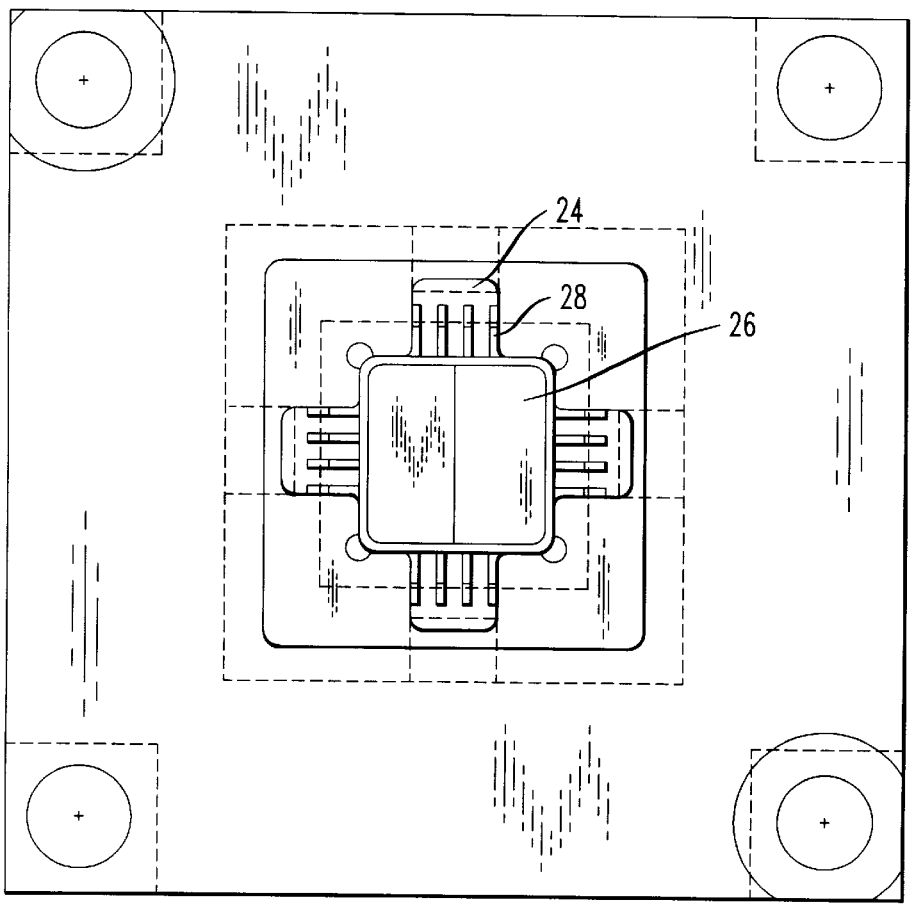
FIG. 3 is a top view of the position of a package being tested with respect to the base portion of the test fixture.

A top view of base 18 is shown in FIG. 3. Aperture 24 of base 18 is formed, as discussed above, such that test package 26 may be inserted in only one orientation. Thus, with base 18 correctly aligned with substrate 12, leads 28 of package 26 will inherently be aligned with the test leads on surface 16 of substrate 12. Evident in this view is the inclusion of four separate sets of leads 28 with package 26. Accordingly, lid 30 would be formed to include a corresponding set of four tabs 34 (illustrated in phantom in FIG. 3), each tab for impinging a separate set of leads 28.

It is to be understood that the test fixture of the present invention may be formed to use with virtually any package design (i.e., two sets of leads, four sets of leads, etc.) and with any number of individual leads. In general, the arrangement of the present invention requires alignment fiducials between the testing substrate and the base, and for the base component to include a central aperture to accommodate the test package. Pressure controlled conductive material is disposed between the base and the substrate to provide the necessary electrical connections (with the use of vertically conductive material resulting in repeatable test parameters) and the fixture lid is formed to exert repeatable pressure on the test package leads. The arrangement of the present invention thus provides for a test fixture capable of testing large volumes of packages at high speeds without introducing unacceptable parasitic inductances or capacitances.

It is to be understood that there are many variations of the arrangement of the present invention that are considered to fall within the spirit and scope of the present invention. For example, there may be other pressure-induced conductive materials that may be used, or other materials used to form the test substrate and leads. In general, the scope of the present invention is considered to be limited only by the claims as appended hereto.

What is claimed is:

1. Apparatus for performing operation tests on an integrated circuit package, the apparatus comprising
  a test substrate including a plurality of test leads formed on a surface thereof, said test substrate further including alignment fiducials formed in relative position with respect to said plurality of test leads;
  pressure-induced conductive material disposed to cover said plurality of test leads;
  a fixture base unit including a plurality of alignment fiducials, said base unit disposed to attach to said test substrate so as to engage the pluralities of alignment fiducials, the base unit formed to include a central aperture sized to allow for the insertion and orientation of an integrated circuit package, wherein the pressure-induced conductive material is visible through the central aperture; and
  a fixture lid unit formed to mate with said base unit and comprising a plurality of vertically oriented tab portions that extend into said base unit aperture upon mating, said tab portions disposed to contact exposed leads of an integrated circuit package, wherein the application of a predetermined force to said fixture lid will force the tabs onto the package leads and induce conductivity within said pressure-induced conductive material.

2. Apparatus as defined in claim 1 wherein the fixture lid includes a set of four tabs, each tab for impinging a separate set of exposed leads formed on an integrated circuit package.

3. Apparatus as defined in claim 1 wherein the pressure-induced material is formed to comprise a thickness no greater than approximately 15 mils.

4. Apparatus as defined in claim 1 wherein the test substrate comprises a high dielectric material.

5. Apparatus as defined in claim 4 wherein the high dielectric material is PTFE.

6. Apparatus as defined in claim 1 wherein the test leads comprise a low resistivity material on a surface of the test substrate.

7. Apparatus as defined in claim 6 wherein the test leads comprise gold.

8. Apparatus as defined in claim 1 wherein the pressure-induced conductive material comprises a conductive interconnect polymer.

9. A method of testing an integrated circuit package, the method comprising the steps of:
  a) providing a test substrate including a plurality of test leads formed on a surface thereof, said test substrate further including alignment fiducials formed in relative position with respect to said plurality of test leads;
  b) placing a layer of pressure-induced conductive material on said test substrate so as to cover said plurality of test leads;
  c) attaching a fixture base unit including a plurality of alignment fiducials to said test substrate so as to engage the pluralities of alignment fiducials, the base unit formed to include a central aperture sized to allow for the insertion and orientation of an integrated circuit package;

d) inserting an integrated circuit package into said base unit aperture so that external leads of said package rest upon the layer of pressure-induced conductive material;

e) placing a fixture lid unit over said base unit, said lid unit comprising a plurality of vertically oriented tab portions that extend downward into said base unit aperture and contact the exposed leads of the integrated circuit package;

f) applying a predetermined force to said fixture lid unit so as to force the tabs onto the package leads and induce conductivity within said pressure-induced conductive material, thereby forming a conductive path between the substrate test leads and the integrated circuit package leads; and g) testing the electric performance of the integrated circuit package.

10. The testing method as defined in claim 9 wherein the testing method is used repeatably to test the performance of a plurality of integrated circuit packages, the method comprising the further steps of:

h) releasing the predetermined force and removing the lid unit;

i) removing the integrated circuit package from the aperture of the base unit;

j) inserting another integrated circuit package into the base aperture; and k) repeating steps e)–g) for each integrated circuit package of the plurality of integrated circuit packages.

* * * * *